(12) United States Patent
Sumi

(10) Patent No.: US 10,278,320 B2
(45) Date of Patent: Apr. 30, 2019

(54) METHOD OF UPGRADING VERSION OF PROGRAM IN COMPONENT MOUNTING LINE

(71) Applicant: Panasonic Intellectual Property Management Co., Ltd., Osaka (JP)

(72) Inventor: Hideki Sumi, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/645,409

(22) Filed: Jul. 10, 2017

(65) Prior Publication Data

US 2018/0092264 A1 Mar. 29, 2018

(30) Foreign Application Priority Data

Sep. 28, 2016 (JP) .................................. 2016-189075

(51) Int. Cl.
| | |
|---|---|
| *G06F 8/65* | (2018.01) |
| *G06F 8/71* | (2018.01) |
| *H05K 13/04* | (2006.01) |
| *H05K 13/08* | (2006.01) |

(52) U.S. Cl.
CPC ............... *H05K 13/08* (2013.01); *G06F 8/65* (2013.01); *G06F 8/71* (2013.01); *H05K 13/04* (2013.01); *H05K 13/0882* (2018.08)

(58) Field of Classification Search
CPC ........... G06F 8/65; H05K 13/08; H05K 13/04
See application file for complete search history.

(56) References Cited

U.S. PATENT DOCUMENTS

| | | | |
|---|---|---|---|
| 2004/0153868 A1* | 8/2004 | Nonaka ............ | G05B 19/41805 714/47.2 |
| 2005/0102052 A1* | 5/2005 | Yoshida ................. | H05K 13/08 700/117 |
| 2006/0136786 A1* | 6/2006 | Nonaka ............ | G05B 19/41805 714/39 |
| 2010/0212151 A1* | 8/2010 | Itose ........................ | H05K 9/00 29/832 |
| 2011/0184548 A1* | 7/2011 | Higashi .............. | H05K 13/0417 700/121 |
| 2012/0206732 A1* | 8/2012 | Sumi .................. | H05K 13/0061 356/500 |
| 2018/0092264 A1* | 3/2018 | Sumi ........................ | G06F 8/65 |

FOREIGN PATENT DOCUMENTS

JP 2008-205075 A 9/2008

* cited by examiner

*Primary Examiner* — Lewis A Bullock, Jr.
*Assistant Examiner* — Theodore E Hebert
(74) *Attorney, Agent, or Firm* — Pearne & Gordon LLP

(57) ABSTRACT

A method of upgrading a version of a program of the present disclosure executes version upgrade of the program of a plurality of component mounting facilities sequentially from a first component mounting facility of the plurality of component mounting facilities to the plurality of component mounting facilities on a downstream side in a component mounting line in which the plurality of component mounting facilities are connected to each other. The first component mounting facility completes mounting of a board under production at the time of receiving an instruction for executing version upgrade and executes the version upgrade after carrying-out of the board to an adjacent component mounting facility is completed among the plurality of component mounting facilities on the downstream side.

10 Claims, 6 Drawing Sheets

METHOD OF UPGRADING VERSION OF PROGRAM IN COMPONENT MOUNTING LINE

BACKGROUND

1. Technical Field

The present disclosure relates to a method of upgrading a version of a program in a component mounting line in which a plurality of component mounting facilities are connected to each other.

2. Description of the Related Art

A program for controlling an operation of a component mounting facility, such as a component mounter, which constitutes a component mounting line, is frequently subjected to version upgrading, which changes contents for the purpose of correcting a problem, improving the operation, and the like in general even after the facility operation starts. During version upgrade, it is necessary to interrupt the production of a board in the component mounting facility. Therefore, measures to shorten the time loss due to version upgrade of the component mounting facility during production have been proposed. For example, see PTL 1 (Japanese Patent Unexamined Publication No. 2008-205075).

In the component mounting facility (electronic component mounter) of PTL 1, there is a storage that has a plurality of storage areas for storing programs, while executing a program stored in one storage area to execute production of a board, a program for version upgrade is written in another storage area, and the version upgrade is executed by switching the areas, thereby the time loss is shortened.

SUMMARY

A method of upgrading a version of a program of the present disclosure executes version upgrade of the program of a plurality of component mounting facilities sequentially from a first component mounting facility of the plurality of component mounting facilities to the plurality of component mounting facilities on a downstream side in a component mounting line in which the plurality of component mounting facilities are connected to each other.

The first component mounting facility completes mounting of a board under production at the time of receiving an instruction for executing version upgrade, and executes the version upgrade after carrying-out of the board to an adjacent component mounting facility is completed among the plurality of component mounting facilities on the downstream side.

DETAILED DESCRIPTION

Figure 1:
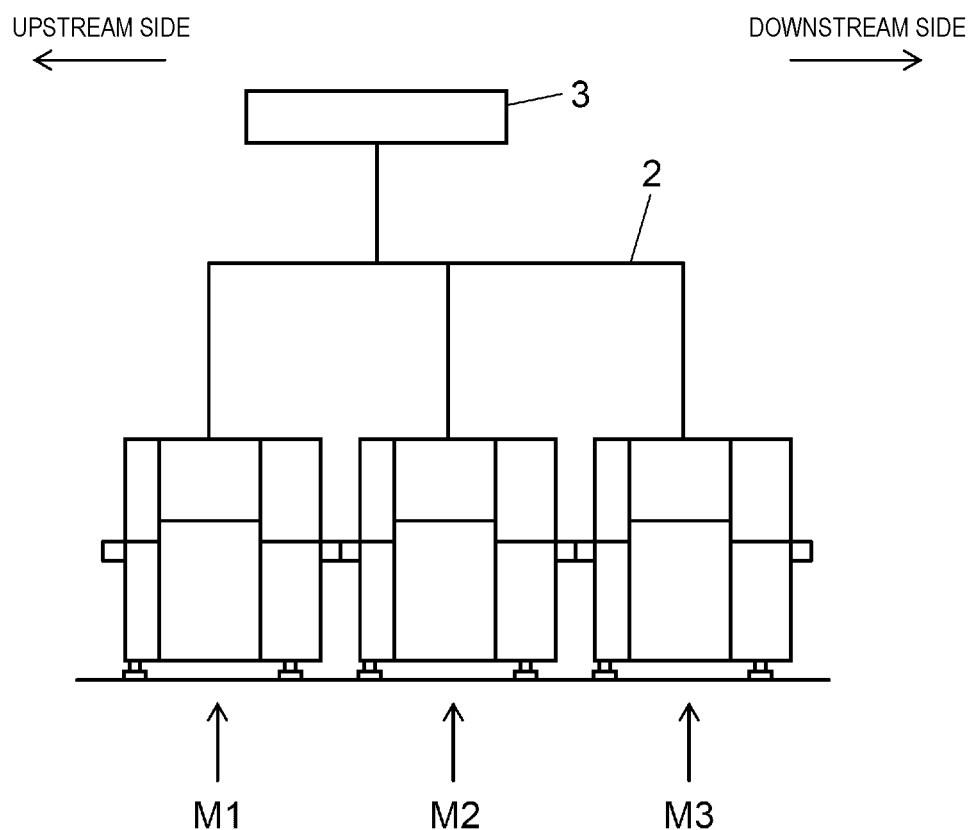
FIG. 1 is a diagram for explaining a component mounting line of the present exemplary embodiment.

In the related arts including PTL 1, it is proposed to shorten the time loss due to version upgrade as a component mounting facility alone. However, there is no mention of measures to shorten the time loss due to version upgrade as a whole component mounting line in which a plurality of component mounting facilities are connected to each other. Therefore, there has been a demand to shorten the production time loss due to the version upgrade of a program as the whole component mounting line.

An exemplary embodiment of the present disclosure will be described in detail below with reference to the drawings. The configurations, shapes and the like which will be described below are illustrative examples and can be appropriately changed according to the specification of the component mounting line and a component mounter (component mounting facility). In the following description, the same reference numerals are given to the corresponding elements in all drawings, and redundant explanations will be omitted.

First, component mounting line 1 will be described with reference to FIG. 1. In FIG. 1, component mounting line 1 connects component mounter M1, component mounter M2, and component mounter M3 from an upstream side to a downstream side in a board transport direction by communication network 2, and the whole is configured to be controlled by management computer 3. Component mounting line 1 has a function of mounting a component on a board and producing a mounting board.

The configuration of component mounting line 1 is not limited to the example shown in FIG. 1. For example, four or more component mounters M1 to M3 may be connected, or two component mounters M1 to M3 may be connected. In addition, the component mounting facility that constitutes component mounting line 1 is not limited to component mounters M1 to M3. For example, the component mounting facility may be a printer that prints cream solder on a board, a printing inspector that inspects the state of solder printed on a board, or a mounting inspector that inspects the state of components mounted on a board. In addition, the component mounting facility may include a board supplier that supplies a board to the downstream side. In this way, component mounting line 1 is connected to the plurality of component mounting facilities.

Figure 2:
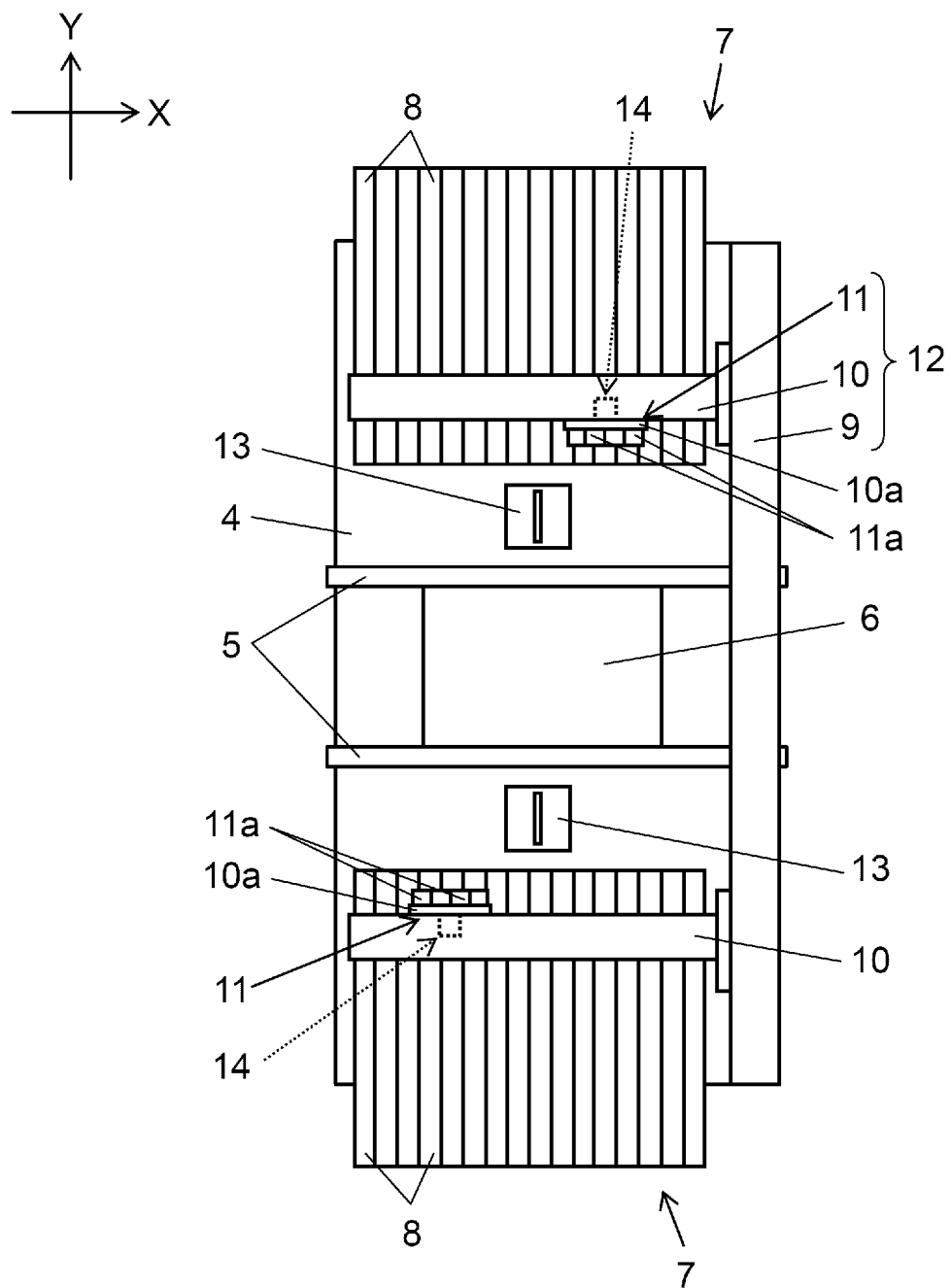
FIG. 2 is a plan view of a component mounter of the present exemplary embodiment.

Next, the configuration of component mounters M1 to M3 will be described with reference to FIG. 2. In FIG. 2, an X direction (the left-right direction in FIG. 2) of the board transport direction and a Y direction (the vertical direction in FIG. 2) orthogonal to the board transport direction are shown as two axial directions orthogonal to each other in a horizontal plane. Component mounters M1 to M3 have the same configuration, and component mounter M1 will be described here. Component mounter M1 has a function of executing a component mounting operation of mounting the components supplied from a component supplier on the board. At the center of base 4, board transport mechanism 5 is disposed in the X direction. Board transport mechanism 5 carries board 6 transported from the upstream side to a mounting working position and holds the positioning by transmitting a board request signal to an adjacent upstream component mounting facility. In addition, upon receiving the board request signal from an adjacent component mounting facility on the downstream side, board transport mechanism 5 carries out board 6 on which the component mounting operation has been completed to the downstream side.

On both sides of board transport mechanism 5, component supplier 7 is disposed. In each component supplier 7, a plurality of tape feeders 8 are mounted in parallel. Tape feeder 8 supplies a component to a component take-out position by a mounting head of a component mounting mechanism which will be described below by pitch-feeding a carrier tape formed with pockets for storing components in the direction from the outside of component supplier 7 to board transport mechanism 5 (tape feeding direction).

At the end of one side in the X direction on the upper surface of base 4, Y-axis beam 9 having a linear drive mechanism is disposed along the Y direction. Similarly, two X-axis beams 10 having the linear drive mechanism are coupled to Y-axis beam 9 in the Y direction. X-axis beam 10 is disposed along the X direction. Two mounting heads 11 are mounted on two X-axis beams 10 so as to be movable in the X direction. Mounting head 11 includes a plurality of suction units 11a that are capable of ascending and descending a component by sucking and holding the component. At the lower end of each of suction units 11a, a suction nozzle for sucking and holding a component is installed.

In FIG. 2, mounting head 11 moves in the X direction and the Y direction by driving Y-axis beam 9 and X-axis beam 10. In this way, two mounting heads 11 suck and take out a component by the suction nozzle from a component take-out position of tape feeder 8 disposed in the corresponding component supplier 7, respectively to mount the component at a mounting point of board 6 positioned in board transport mechanism 5. Y-axis beam 9, X-axis beam 10, and mounting head 11 constitute component mounting mechanism 12 for mounting the component on board 6 by moving mounting head 11 holding the component.

Component recognition camera 13 is disposed between component supplier 7 and board transport mechanism 5. When mounting head 11 which has taken out the component from component supplier 7 moves above component recognition camera 13, component recognition camera 13 takes the image of the component held in mounting head 11 and recognizes a holding position of the component. Board recognition camera 14 is attached to plate 10a to which mounting head 11 is attached. Board recognition camera 14 moves integrally with mounting head 11.

As mounting head 11 moves, board recognition camera 14 moves above board 6 positioned in board transport mechanism 5, takes the image of a board mark (not shown) provided on board 6, and recognizes the position of board 6. In addition, board recognition camera 14 moves above the component take-out position of the component of tape feeder 8 and recognizes the state of the carrier tape near the component take-out position. In the component mounting operation to board 6 by mounting head 11, the mounting position is corrected by taking into consideration a recognition result of the component by component recognition camera 13 and a recognition result of a board position by board recognition camera 14.

Next, the configuration of the control system of component mounting line 1 will be described with reference to FIG. 3. Component mounters M1 to M3 have the same configuration, and component mounter M1 will be described here. Mounting controller 21 included in component mounter M1 is an arithmetic processor having a CPU function and is provided with update controller 21a as an internal processing function. Mounting storage 22 is a storage device, and stores update program 22a and the like in addition to a processing program. Display 23 is a display device such as a liquid crystal panel and displays various data, information, and the like. Communicator 24 is a communication interface and exchanges signals and data with management computer 3, other component mounters M2 and M3 via communication network 2.

By executing the processing program stored in mounting storage 22, mounting controller 21 controls each portion of board transport mechanism 5, component supplier 7, component mounting mechanism 12, component recognition camera 13, board recognition camera 14, and display 23 and executes the component mounting operation in which the component supplied from component supplier 7 is mounted on board 6 held by board transport mechanism 5.

Figure 3:
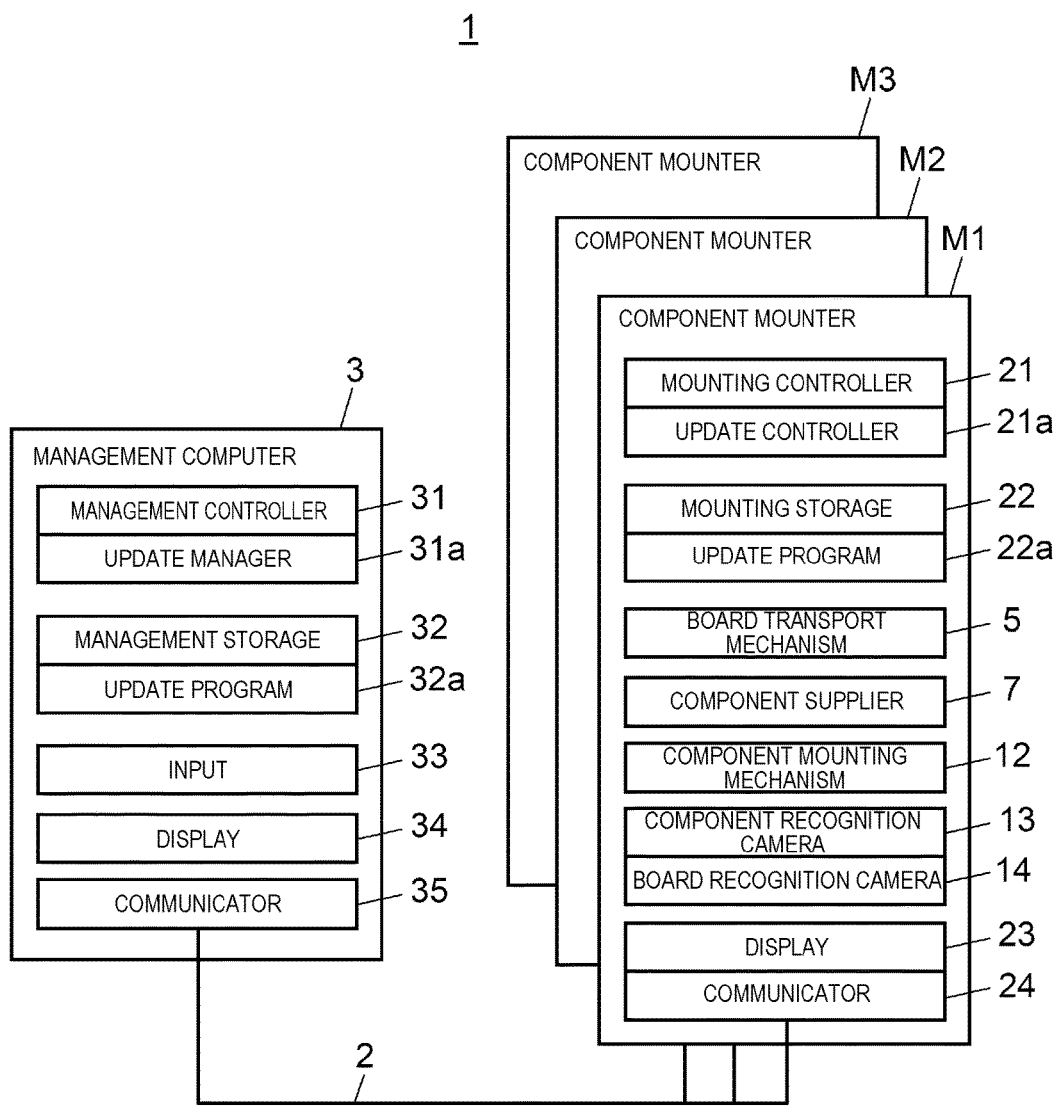
FIG. 3 is a block diagram showing a configuration of a control system of the component mounting line of the present exemplary embodiment.

In FIG. 3, update controller 21a executes update processing of the program for upgrading a version of the processing program or operation parameters stored and included in the storage of a controller (not shown) included in each portion of mounting storage 22 and component mounter M1 to the latest version. Specifically, at the time of receiving a update instruction from management computer 3, or receiving a start report indicating that an adjacent component mounting facility (for example, component mounters M1 to M3) on the upstream side has started the update processing, update controller 21a starts the update processing of the program.

In addition, immediately after the start of the update processing, update controller 21a stops the board request signal to an adjacent component mounting facility on the upstream side. Thereby, board 6 to be a component mounting target is prevented from being newly carried in from the upstream side. In addition, at the time of starting the update processing, update controller 21a completes mounting of the component on board 6 under production and carries out all boards 6 in component mounter M1 to the component mounting facility on the downstream side. In addition, update controller 21a requests management computer 3 to transmit update program 22a for version upgrade and stores update program 22a transmitted from management computer 3 in mounting storage 22.

In addition, when all boards 6 are carried out to the downstream side, update controller 21a transmits a start report indicating that the update processing has been started to the adjacent component mounting facility on the downstream side. In addition, update controller 21a executes update program 22a, and when execution of update program 22a is completed, restarts each portion requiring restart (turns on the power after turning off the power). In addition, upon completion of the restart, update controller 21a resumes the board request signal to an adjacent component mounting facility on the upstream side and resumes production of board 6.

In FIG. 3, management computer 3 includes management controller 31, management storage 32, input 33, display 34, and communicator 35. Management controller 31 is an arithmetic device such as a CPU and includes an internal processor such as update manager 31a. Management storage 32 is a storage device and stores not only component mounting data for overall control of component mounting line 1 but also update program 32a and the like.

Update program 32a is a program for upgrading a version of the processing program and operation parameters of the component mounting facility included in component mounting line 1 to the latest version and is stored corresponding to the type of the component mounting facility. Update manager 31a manages and controls version upgrade of the program of a plurality of component mounting facilities included in component mounting line 1. Specifically, update manager 31a transmits an update instruction for instructing the first component mounting facility (most upstream side) of component mounting line 1 to execute version upgrade of the program. In addition, in response to a request from each component mounting facility (component mounters M1 to M3), update manager 31a transmits update program 32a corresponding to the component mounting facility to a request source.

In FIG. 3, input 33 is an input device such as a keyboard, a touch panel, a mouse, and the like, and is used at the time of inputting operation commands and data. Display 34 is a display device such as a liquid crystal panel and displays not only various data but also report information and the like. Communicator 35 is a communication interface and exchanges signals and data with component mounters M1 to M3 via communication network 2.

Figure 4:
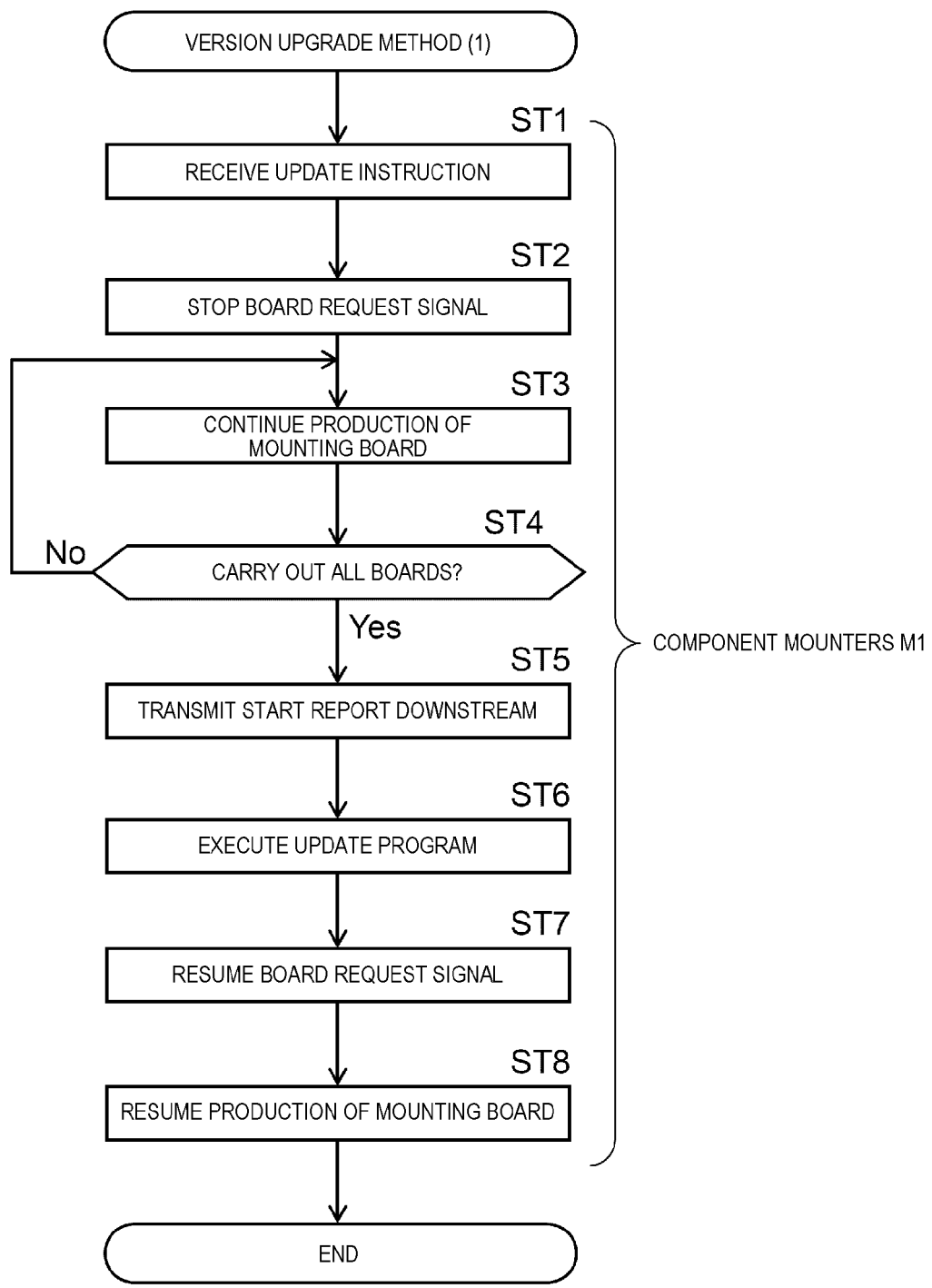
FIG. 4 is a flow diagram of a method of upgrading a version of a program in a first component mounter of the component mounting line of the present exemplary embodiment.
Figure 5:
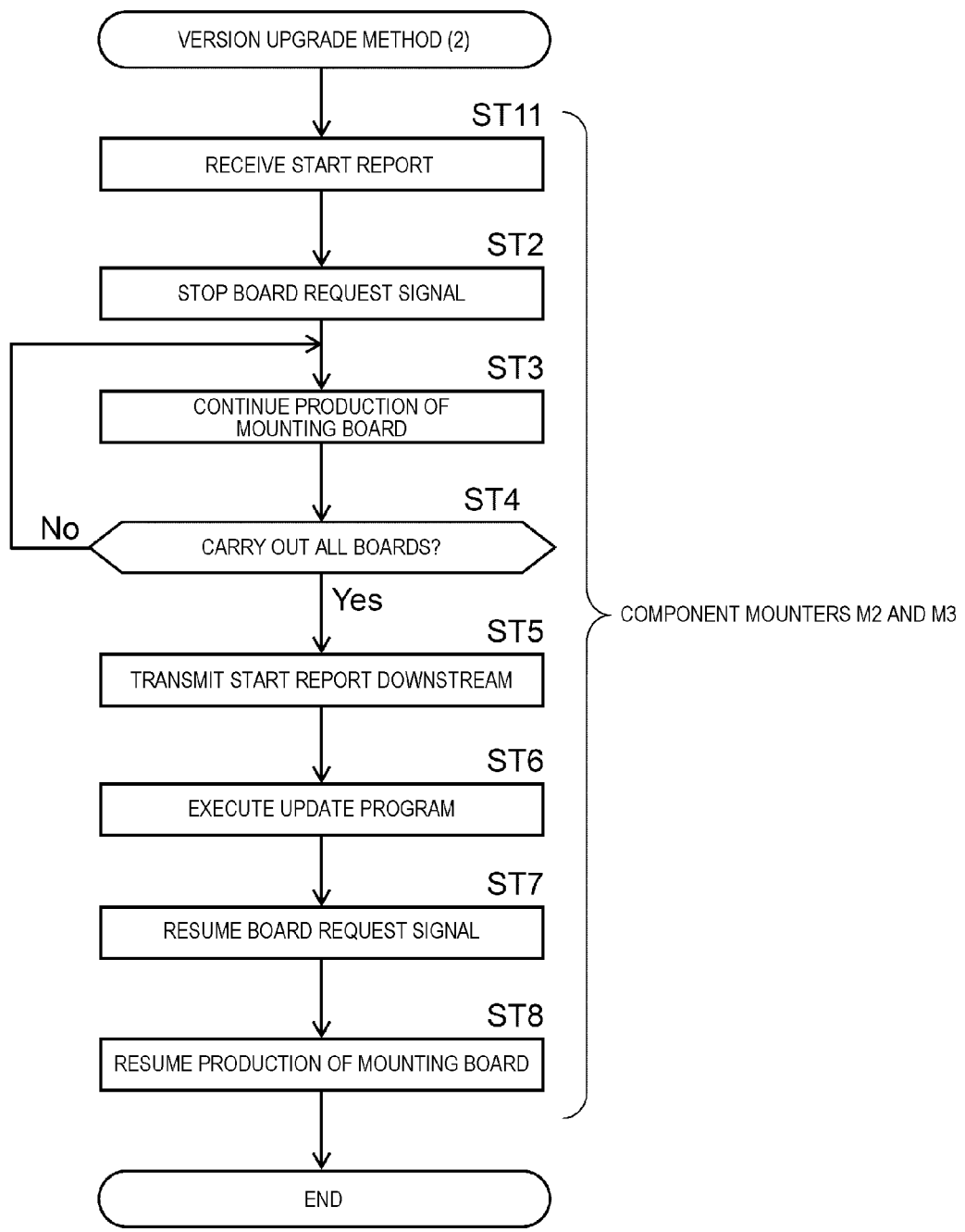
FIG. 5 is a flow diagram of the method of upgrading a version of a program in a second and subsequent component mounters from the first component mounter of the component mounting lines of the present exemplary embodiment.

Next, in accordance with the flow of FIGS. 4 and 5, a method of upgrading the version of the program (update processing of the program) in the component mounting line will be described with reference to FIGS. 6A to 6D. FIG. 4 shows the flow of the update processing of the program in component mounter M1 which is the first component mounting facility (most upstream) among the plurality of component mounting facilities included in component mounting line 1. FIG. 5 shows the flow of the update processing of the program in component mounters M2 and M3 which are the second and subsequent component mounting facilities among the plurality of component mounting facilities included in component mounting line 1. FIGS. 6A to 6D is an explanatory diagram of the method of upgrading the version of the program in component mounting line 1 of the present exemplary embodiment. In FIGS. 6A to 6D, board 6(1), board 6(2), board 6(3), board 6(4), board 6(5), and board 6(6) show board 6 in each situation.

Figure 6A:
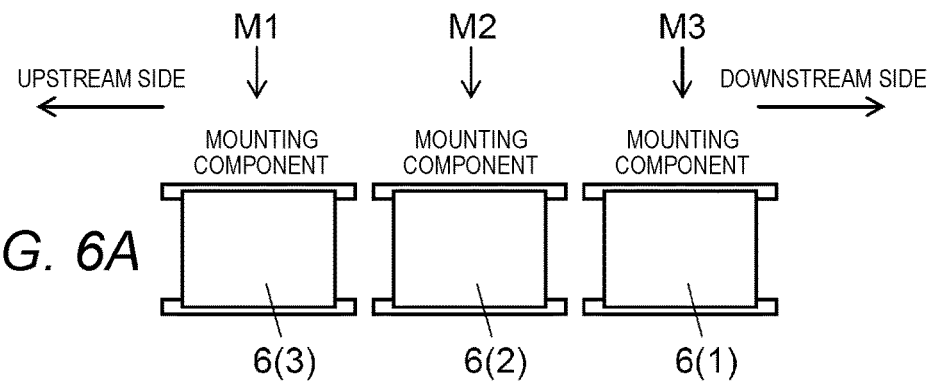
FIGS. 6A to 6D are explanatory diagrams of the method of upgrading a version of a program in the component mounting line of the present exemplary embodiment.

Here, an example will be described in which version upgrade of the program is executed in three component mounters M1 to M3 included in component mounting line 1. In addition, in component mounting line 1 just before starting the update processing, as shown in FIG. 6A, it is assumed that component mounter M1 is executing the component mounting operation with respect to board 6(3), component mounter M2 executing the component mounting operation with respect to board 6(2), and component mounter M3 executing the component mounting operation with respect to board 6(1).

First, the update processing of the program in component mounter M1 will be described with reference to FIG. 4. Component mounter M1 which is the first component mounting facility receives an update instruction from management computer 3 (ST1: a step of receiving an update instruction). In this way, the update processing of the program is started. Next, update controller 21a of component mounter M1 stops the board request signal to an adjacent component mounting facility (not shown, such as board supplier and a printing inspector) on the adjacent upstream side (ST2: a step of stopping a board request signal).

Production of a mounting board is continued in component mounter M1 (ST3: a step of producing a board), and update controller 21a determines whether or not all boards 6 have been carried out to the downstream side from board transport mechanism 5 of component mounter M1 (ST4: a step of determining completion of carrying-out). That is, component mounter M1 continues to mount a component on board 6(3) (ST3) until board 6(3) under production is carried out (No in ST4) at the time of receiving an instruction (update instruction) for executing version upgrade.

Figure 6B:
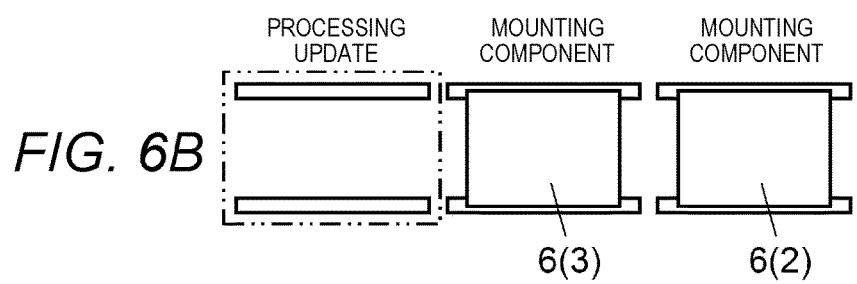

As shown in FIG. 6B, when the component mounting operation in component mounter M1 is completed and board 6(3) is carried out to component mounter M2 on the downstream side (Yes in ST4), update controller 21a transmits a start report indicating that version upgrade has been started to component mounter M2 (ST5: a step of transmitting a start report). Next, update controller 21a downloads update program 22a from management computer 3 and executes update program 22a (ST6: a step of executing an update program execution). In this way, the processing program of mounting storage 22 is updated to the latest version. The download of update program 22a may be executed in parallel with the production of mounting board (ST3).

Figure 6C:
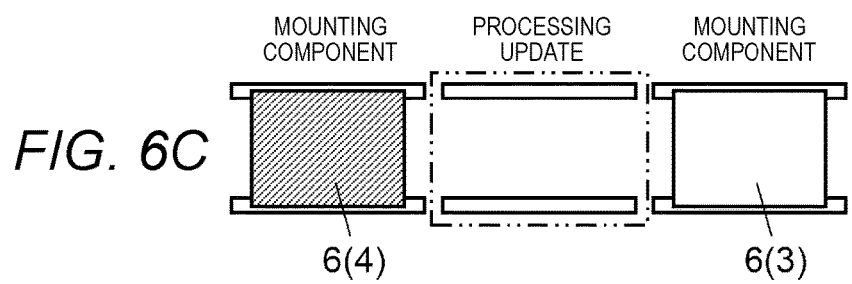

Next, after completing the restart of each portion requiring restart, update controller 21a resumes the board request signal to an adjacent component mounting facility on the upstream side (ST7: a step of resuming a board request signal). Next, update controller 21a resumes production of a mounting board in component mounter M1 (ST8: a step of resuming board production). In this way, version upgrade of the program in component mounter M1 is completed, and as shown in FIG. 6C, the component mounting operation to board 6(4) transported from the upstream side is started.

As described above, component mounter M1 (the first component mounting facility) completes mounting to board 6(3) under production (ST3) at the time of receiving an instruction (update instruction) for executing version upgrade (ST1). After carrying-out of board 6(3) to component mounter M2 (the adjacent component mounting facility on the downstream side) is completed (Yes in ST4), version upgrade is executed (ST5 to ST8).

Next, the update processing of the program in the component mounting facilities (component mounters M2 and M3) on the downstream side from the first component mounting facility (component mounter M1) will be described with reference to FIG. 5. The update processing of the program in component mounter M2 and component mounter M3 is the same, and component mounter M2 will be described here. In component mounter M1, the signal that triggers the update processing (version upgrade) of the program is an update instruction transmitted from management computer 3. On the contrary, in component mounter M2, the signal that triggers the update processing (version upgrade) of the program is a start report transmitted from component mounter M1 but is different from that in component mounter M1. Hereinafter, the same steps as those of the update processing of the program in component mounter M1 are denoted by the same reference numerals and a detailed description thereof will be omitted.

In component mounting line 1 just before component mounter M2 starts the update processing, as shown in FIG. 6B, it is assumed that component mounter M1 executes the update processing of the program, component mounter M2 executes the component mounting operation with respect to board 6(3), and component mounter M3 executes the component mounting operation with respect to board 6(2).

In FIG. 5, component mounter M2 that is performing component mounting operation on board 6(3) receives a start report transmitted from component mounter M1 that is an adjacent component mounting facility on the upstream side (ST11: a step of receiving a start report). In this way, the update processing of the program is started. Next, update controller 21a of component mounter M2 stops the board request signal to component mounter M1 (the adjacent component mounting facility on the upstream side) in the step of stopping a board request signal (ST2).

That is, component mounter M2 (each of the component mounting facilities on the downstream side from the first component mounting facility) stops the board request signal to component mounter M1 (the adjacent component mounting facility on the upstream side) (ST2) at the time of receiving the start report from component mounter M1 (the adjacent component mounting facility on the upstream side) (ST11).

Next, at the time of receiving the start report, the step of producing a board (ST3) of board 6(3) under production is executed until board 6(3) is carried out to component mounter M3. In the step of determining completion of carrying-out (ST4), when it is determined that carrying-out is completed (Yes), update controller 21a executes the step of transmitting a start report (ST5) to transmit the start report to component mounter M3 which is an adjacent component mounting facility on the downstream side. Next, update controller 21a executes the step of executing an update program execution (ST6) to download update program 22a from management computer 3 and execute the program.

Next, after executing necessary restart, update controller 21a executes the step of resuming a board request signal (ST7) to resume the board request signal to component mounter M1. Next, update controller 21a executes the step of resuming board production (ST8) to resume the production of a mounting board in component mounter M2. In this way, version upgrade of the program in component mounter M2 is completed, as shown in FIG. 6D, board 6(4) on which a component is mounted is transported in component mounter M1 whose program version has been upgraded, and the component mounting operation to board 6(4) is started by component mounter M2 whose program version has been upgraded.

As described above, component mounter M2 (each of the component mounting facilities on the downstream side from the first component mounting facility) completes mounting of board 6(3) under production (ST3) at the time of receiving a start report indicating that version upgrade has started from component mounter M1 (the adjacent component mounting facility on the upstream side) (ST11). After carrying-out of board 6(3) to component mounter M3 (an adjacent component mounting facility on the downstream side) and transmission of the start report (ST5) are completed, version upgrade is executed (ST6 to ST8).

Figure 6D:
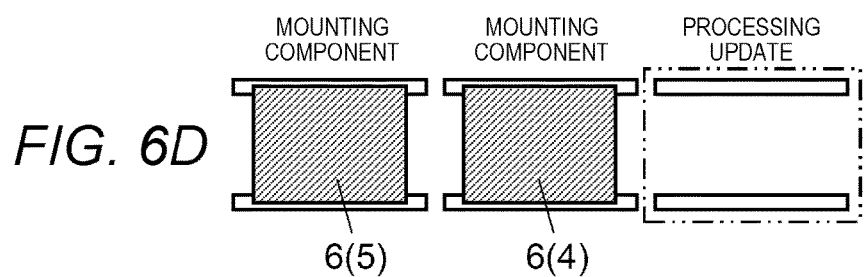

As shown in FIG. 6D, upon receiving the start report transmitted from component mounter M2 in the step of receiving a start report (ST11), component mounter M3 starts the update processing.

Next, the overall situation of component mounting line 1 where the update processing of the program is executed will be described. In FIGS. 6B, 6C, and 6D, component mounters M1 to M3 in which the update processing of the program is executed are surrounded by a two-dot chain line. In addition, shaded hatching is applied to board 6 (board 6(4) and board 6(5)) where the component mounting operation is executed by component mounters M1 to M3 whose programs have been upgraded.

As shown in FIGS. 6B, 6C, and 6D, in component mounting line 1, version upgrade of the program of the component mounting facilities is executed sequentially starting from the first one (component mounter M1) of the plurality of component mounting facilities (component mounters M1 to M3) toward the downstream side. In this way, it is possible to prevent component mounting to board 6 from being duplicated by component mounters M1 to M3 having different versions of the processing program. More specifically, on board 6(1), board 6(2), and board 6(3), the component mounting operation is executed in an old version of the processing program, and on board 6(4) and board 6(5), the component mounting operation is executed in an updated new version of the processing program.

In addition, in component mounters M1 to M3 other than component mounters M1 to M3 in which the update processing of the program is being executed, the component mounting operation to board 6 is continued. For example, in FIG. 6B, a plurality of component mounting facilities (component mounters M2 and M3) other than the component mounting facility (component mounter M1) which is executing version upgrade continue production of board 6. Thereby, it is possible to shorten the time during which component mounters M1 to M3 stop production of a mounting board for the update processing of the program and shorten the production time loss as whole component mounting line 1.

As described above, a method of upgrading the version of the program in the component mounting line of the present exemplary embodiment, executes version upgrade of the program of the component mounting facilities sequentially starting from the first one (component mounter M1) of the plurality of component mounting facilities (component mounters M1 to M3) toward the downstream side.

At that time, the first component mounting facility (component mounter M1) completes mounting on board 6 under production at the time of receiving an instruction for executing version upgrade (ST1) and executes version upgrade (ST5 to ST8) after carrying-out of board 6 to the adjacent component mounting facility (component mounter M2) on the downstream side is completed (Yes in ST4). Thereby, since it is possible to continue production of a mounting board in the other component mounting facilities which are executing version upgrade, it is possible to shorten the production time loss due to the version upgrade of the program as whole component mounting line 1.

In the above, an example in which component mounters M1 to M3 which have one set of board transport mechanism 5 with one place where board 6 is placed as a component mounting facility is described, but application of the method of upgrading the version of the program the component mounting line of the present exemplary embodiment is not limited to such component mounters M1 to M3. For example, the component mounting facilities connected in component mounting line 1 may be a component mounter with two pairs of board transport mechanism 5 in the Y direction in parallel and may be a component mounter with a place where a plurality of boards 6 are placed in board transport mechanism 5. In that case, in the step of determining completion of carrying-out (ST4), it is determined whether or not all boards 6 have been carried out from all board transport mechanisms 5 included in the component mounter.

According to the present disclosure, it is possible to shorten the production time loss due to the version upgrade of a program as the whole component mounting line.

What is claimed is:
1. A method of upgrading a version of a program in a component mounting line in which a plurality of component mounting facilities are connected to each other, the method executing version upgrade of the program of the plurality of component mounting facilities sequentially from a component mounting facility on an upstream side of the plurality of component mounting facilities to a component mounting facility on a downstream side of the plurality of component mounting facilities, the method comprising:

completing mounting of a board under production in the component mounting facility on the upstream side at a time of receiving an instruction for executing version upgrade in the component mounting facility on the upstream side;

executing the version upgrade at the component mounting facility on the upstream side after carrying-out of the board to an adjacent component mounting facility on the downstream side is completed;

receiving a start report at the adjacent component mounting facility on the downstream side indicating that the version upgrade has started from the component mounting facility on the upstream side; and starting a version upgrade processing of the program at the component mounting facility on the downstream side at a time of receiving the start report from the component mounting facility on the upstream side.

2. The method of claim 1,
wherein the plurality of component mounting facilities are connected to a communication network and controlled by a management computer.

3. The method of claim 2,
wherein the instruction for executing the version upgrade is transmitted from the management computer to the first component mounting facility.

4. The method of claim 1, further comprising:
completing mounting of the board under production at a time of receiving a start report indicating that the version upgrade has started from an adjacent component mounting facility on an upstream side in each of the plurality of component mounting facilities on the downstream side; and executing the version upgrade at the adjacent component mounting facility on the downstream side after carrying-out of the board to a next adjacent component mounting facility on the downstream side.

5. The method of claim 4, further comprising:
stopping a board request signal to the adjacent component mounting facility on the upstream side at the time of receiving the start report from the adjacent component mounting facility on the upstream side in each of the plurality of component mounting facilities on the downstream side.

6. The method of claim 5,
wherein the plurality of component mounting facilities other than the component mounting facility that is executing the version upgrade continue production of the board.

7. The method of claim 4,
wherein the plurality of component mounting facilities other than the component mounting facility that is executing the version upgrade continue production of the board.

8. The method of claim 1,
wherein the plurality of component mounting facilities other than the component mounting facility that is executing the version upgrade continue production of the board.

9. The method of claim 1,
wherein the start report is transmitted from the adjacent component mounting facility on the upstream side.

10. The method of claim 1,
wherein an update controller of the component mounting facility on the upstream side transmits the start report.

* * * * *